(12) United States Patent
Yi

(10) Patent No.: US 6,585,476 B1
(45) Date of Patent: *Jul. 1, 2003

(54) SURFACE MOUNTING DEVICE

(75) Inventor: Yun Hyung Yi, Kyungki-do (KR)

(73) Assignee: Mirae Corporation, Choongchungnam-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/442,762

(22) Filed: Nov. 18, 1999

(30) Foreign Application Priority Data

Jun. 16, 1999 (KR) .............................. 99-22488

(51) Int. Cl.⁷ .................................. B25J 9/06
(52) U.S. Cl. ................... 414/749.1; 29/833; 29/832; 901/16
(58) Field of Search ................. 414/749.1; 901/16; 29/833, 832, 840, 740

(56) References Cited

U.S. PATENT DOCUMENTS 4,383,870 A * 5/1983 Creech ........................ 901/16
5,002,448 A * 3/1991 Kamijima et al. ......... 901/16 X
5,084,959 A * 2/1992 Ando et al. ................ 29/833 X
5,165,296 A * 11/1992 Yanagisawa ............... 901/16 X
5,172,468 A * 12/1992 Tanaka et al. ............. 29/740 X
5,992,013 A * 11/1999 Morita ........................ 29/833

* cited by examiner

*Primary Examiner*—Donald W. Underwood
(74) *Attorney, Agent, or Firm*—Fleshner & Kim, LLP

(57) ABSTRACT

A surface mounting device is provided on which work can be performed more efficiently and correctly by providing one or more moving means movable together or independently to a predetermined portion of a X-Y gantry. The surface mounting device includes one or more X frames configured to be driven in a predetermined direction together or independently; main driving means for driving the one or more X frames; one or more moving means disposed on a selected portion of the X frames and having one or more manipulators movable in a predetermined direction together or independently; sub driving means configured to drive the one or more manipulators together or independently; one or more head and vision portions disposed on the one or more moving means; and a component supplying portion configured to supply a component to the head.

5 Claims, 5 Drawing Sheets

SURFACE MOUNTING DEVICE

BACKGROUND OF THE INVENTION

1. Field of the Invention

The present invention relates to a surface mounting device, and more particularly, to a surface mounting device on which work can be performed more efficiently and correctly by providing one or more moving means movable together or independently to a predetermined portion of an X-Y gantry.

2. Background of the Related Art

In general, a conventional surface mounting device of a semiconductor device is constructed so that a pattern for an electronic component is acknowledged by an image processing method and a position for mounting the component on a printed circuit board is determined.

A conventional surface mounting device of a semiconductor device is shown in FIG. 1.

As shown in FIG. 1, the conventional semiconductor device 1 is comprised of an X-Y frame 2, a head 3 which is supported for movement in an X-Y direction, a component supplying portion 4, a position determining portion 5, and a conveyor 7 for carrying a printed circuit board 6. Furthermore, the X-Y frame 2 is comprised of an X frame 2b and a Y frame 2a.

An operation of the semiconductor device having the above construction is as follows.

When the X-Y frame is controlled to operate by a driving means (not shown), the head 3 is moved to an electronic component 8 mounted on the component supplying portion 4. At this time, the electronic component 8 is disposed within a subject area of a photographing means in a mounting direction.

The suction nozzle 3a grasps the electronic component by a vacuum suction method as the suction means, which is connected to the suction nozzle 3a of the head 3. In this state, the head 3 moves to the position determining portion 5 to be mounted on the component as the X-Y frame 2 is controlled to operate by the driving means.

Next, the head 3 moves to a position that is determined by the position determination portion 5 on the printed circuit board, which is carried by the conveyor 7. Accordingly, the electronic component 8 grasped by the suction nozzle 3a of the head 3 is mounted.

The suction nozzle 3a of the head 3 allows the electronic component 8 to be released by stopping the suction means connected thereto. By the foregoing operations, one electronic component 8 is mounted on the printed circuit board 6.

The conventional semiconductor device includes the X-Y frame having a plurality of the suction nozzles. However, to mount the component sucked to the nozzle on the printed circuit board, only one component by one operation should be mounted on the printed circuit board by the operation of the X-Y frame.

This causes production efficiency to be deteriorated. Further, if the X-Y frame operates incorrectly, a mounting speed becomes low and if the X-Y frame is constructed to be large, it is hard to achieve a satisfactory speed and correction thereof.

SUMMARY OF THE INVENTION

Accordingly, the present invention has been invented to solve the above problems. It is an object to provide a surface mounting device on which a picking and placing operation for a component can be performed more efficiently by constructing in various form moving means and sub moving means.

Another object of the present invention is to provide a surface mounting device on which precision can be improved by mounting a component using a small gantry when distance movement is necessary and by moving a plurality of the moving means together or independently within a predetermined working area.

To achieve the above objects, the present invention provides a surface mounting device comprising one or more X, Y frames for moving in a predetermined direction together or independently; main driving means disposed at a selected portion of the X, Y frames for driving the one or more X, Y frames; one or more moving means disposed on the one or more X, Y frames and having one or more manipulators movable in a predetermined direction together or independent; sub driving means for driving the one or more moving means together or independently; one or more head and vision portions disposed on the moving means; and a component supplying portion for supplying a component to the one or more head and vision portions.

BRIEF DESCRIPTION OF THE DRAWINGS

Other objects and aspects of the invention will become apparent from the following description of embodiments with reference to the accompanying drawings in which.

DETAILED DESCRIPTION OF PREFERRED EMBODIMENTS

Now, a preferred embodiment of the present invention will be described in detail with reference to the drawings.

Figure 1:
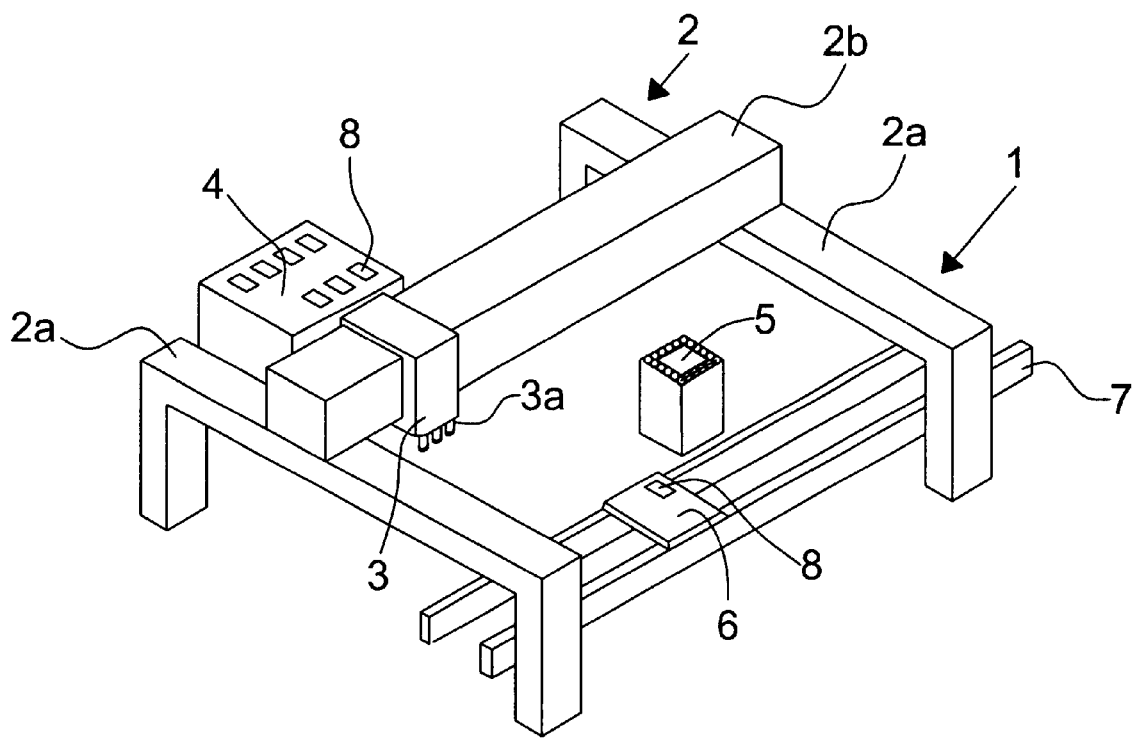
FIG. 1 is a perspective view of a conventional surface mounting device.
Figure 2:
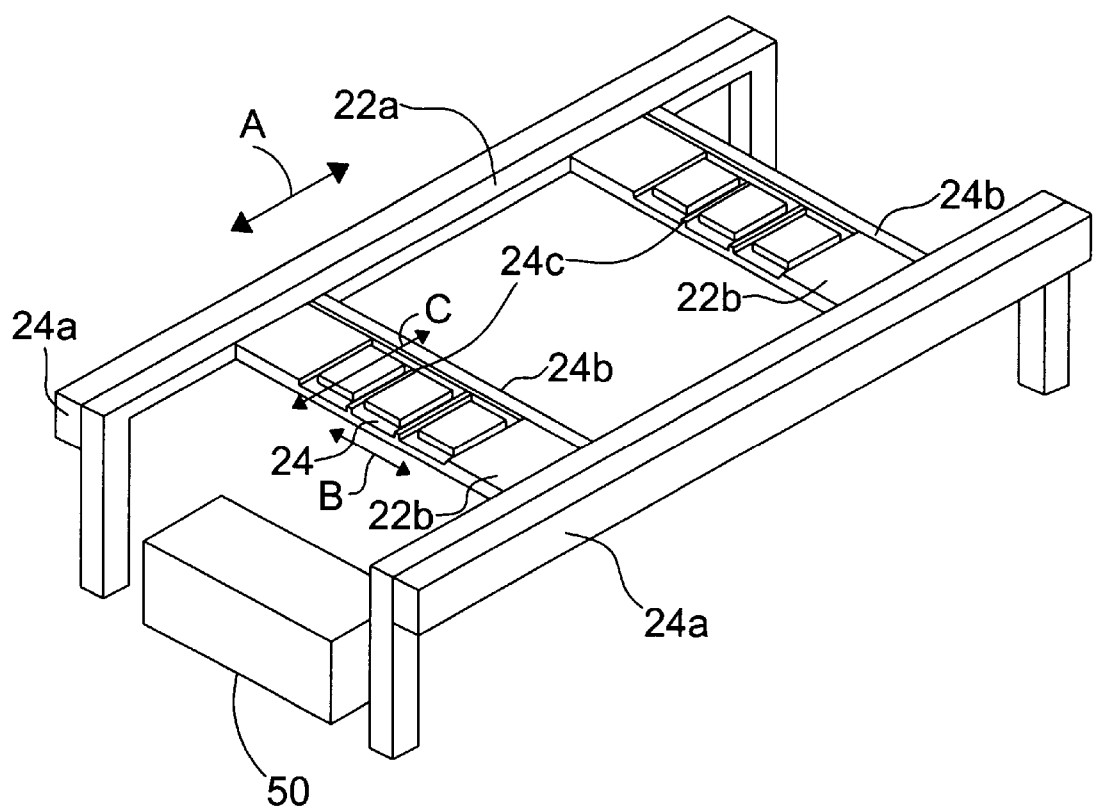
FIG. 2 is a perspective view of a surface mounting device according to the present invention.

A surface mounting device according to the present invention is constructed, as shown in FIG. 2, so that a Y-axis frame 22a is disposed to be crossed to an X-axis frame 22b. Here, it is described in the case of use of a dual gantry, however, the present invention can be applied to a single gantry.

The Y-axis frame 22a and the X-axis frame 22b are provided with high speed linear motors 24a and 24b at a certain respective portion thereof.

It is preferable that the linear motor 24a be provided on every Y frame 22a to increase precision, although it can be disposed on only one frame of the Y frame 22a. The linear motor 24a drives the X frame with respect to the Y frame in a direction of the arrow A in FIG. 2

Furthermore, the X frame 22b is provided with a plurality of moving means 24 at a certain portion thereof. The plurality of moving means 24, as shown in FIG. 2, are movable in a direction of the arrow B.

That is, the moving means 24 can be moved in a horizontal direction by the linear motor 24b. It can also be moved in a longitudinal direction by a high speed motor 24c, as a sub driving means.

The high speed motor 24c is selected from among, for example, a surface motor, a step motor, a rotary motor, and a means for converting a rotational movement to a linear movement.

A driving means 34 is provided for one or more manipulators 32 at a lower portion of the moving means. At this time, the manipulator 32 is, according to a user's desire, provided with means for picking up and placing a component and means for processing a component if necessary.

Furthermore, the manipulator 32 includes a head 42 and a vision portion 52. The driving means for driving the manipulator 32 is selected from among, for example, a surface motor, a linear motor, and a means for converting a rotational movement to a linear movement.

Meanwhile, the manipulator 32 can be replaced with a bar 62 connected to an axis 60 to move the head 42a in the left and right directions.

Furthermore, the axis 60 is rotated in a direction (of arrow E in FIG. 4) by the driving of the sub driving means 34a. The head 42a is constructed in both left and right directions along the bar 62, unlike the head 42.

The bar 62 is provided with the head 42a, and includes one or more vision portions (not shown).

Figure 5A:
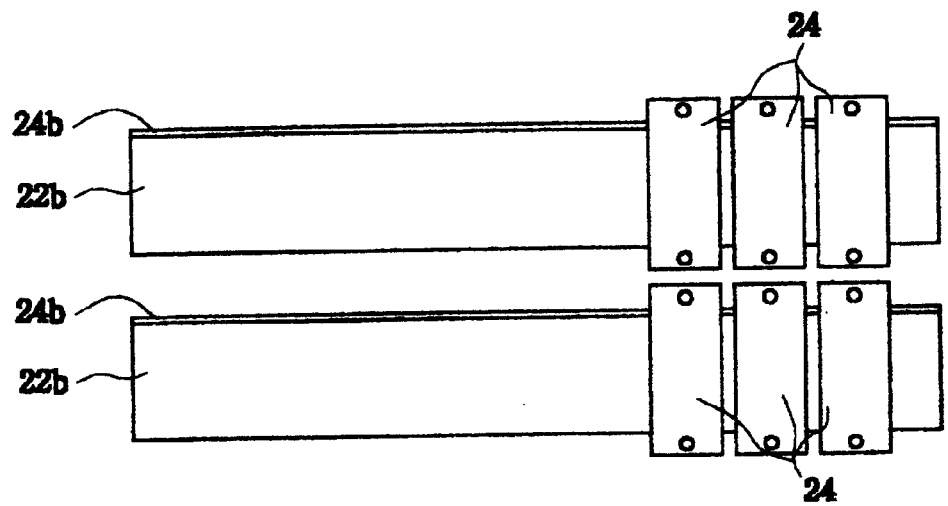
FIGS. 5a, 5b and 5c are views of moving means according to the present invention.
Figure 5B:
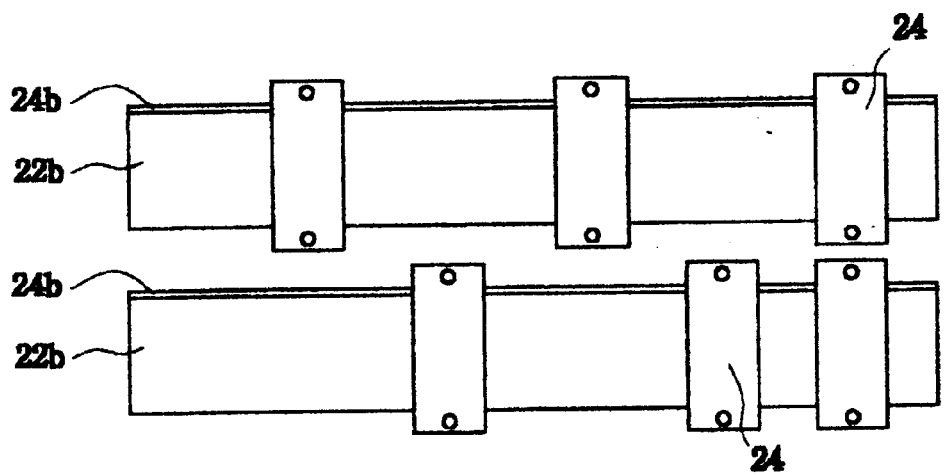
Figure 5C:
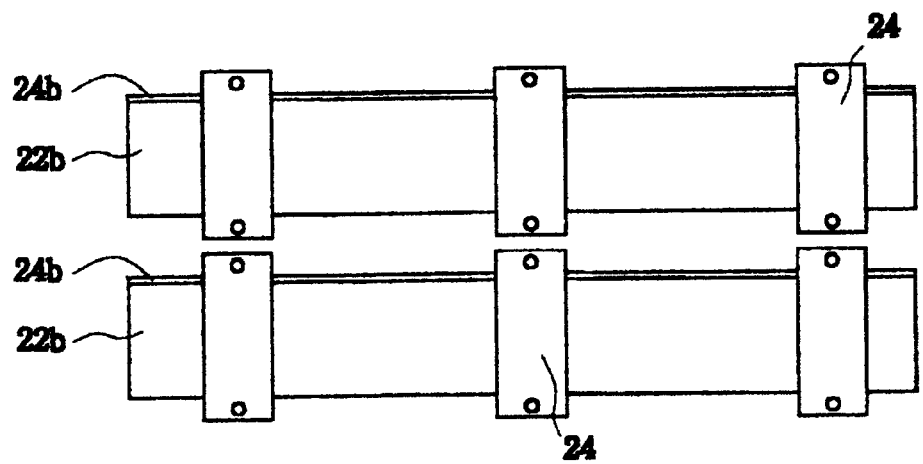

A plurality of moving means 24, as shown in FIG. 5a, are provided on one side of the X frame 22b. Accordingly, as shown in FIGS. 5b and 5c, they can be operated together or independently to move to each different position on the X frame 22b.

Figure 6:
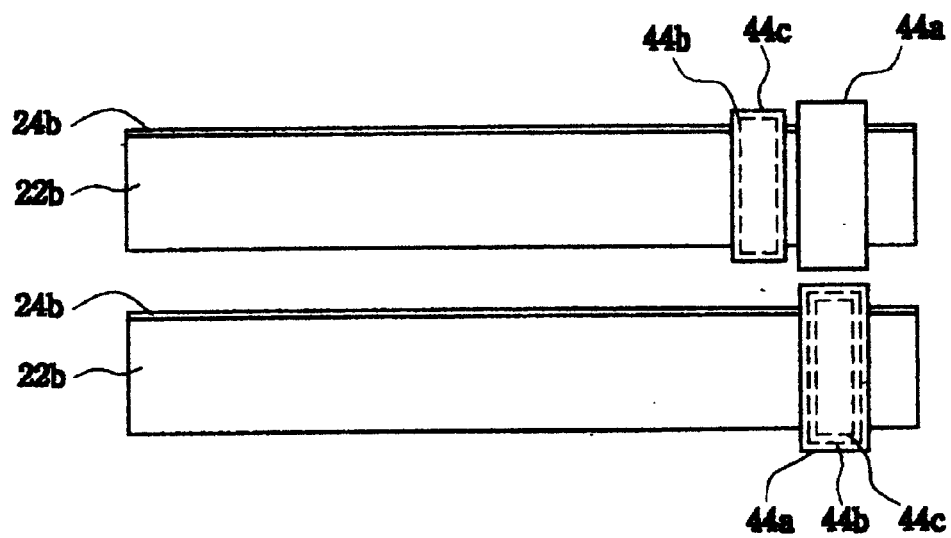
FIG. 6 is a schematic view of a zooming function of the moving means according to the present invention.

Meanwhile, the moving means, as shown in FIG. 6, can be constructed to overlap one another with a zoom shape. That is, the moving means 44a, 44b and 44c can be constructed to overlap according to the user's desire.

Accordingly, the moving means can be moved to set a working environment and can be controlled from outside the work environment by an adjusting program.

Furthermore, when the moving means 44a, 44b and 44c are constructed to overlap the head or the vision portion of the respective moving means must be constructed to overlap inside by separate means. If possible, it is preferable that the vision portion is disposed at the outer peripheral surface of the moving means 44a, 44b and 44c.

An operation of the surface mounting device having the above construction will now be described.

Figure 3:
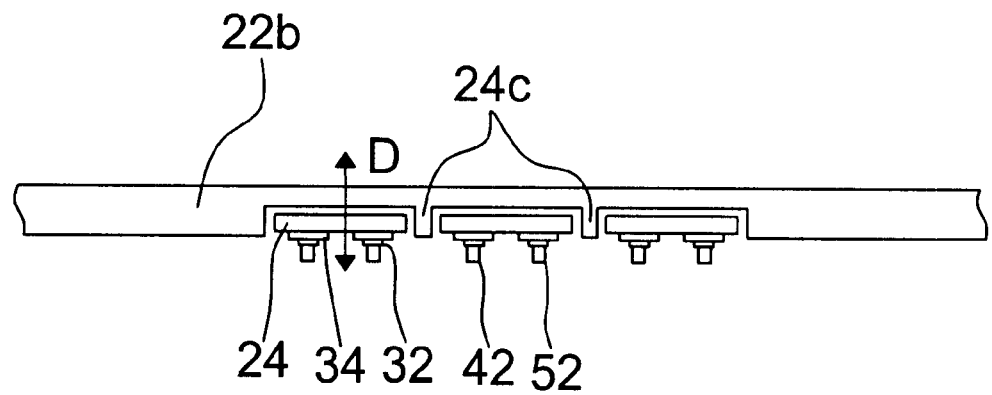
FIG. 3 is a view of moving means according to the present invention.

As shown in FIGS. 2 and 3, the X frame 22b, or a certain portion thereof, is provided with a plurality of moving means 24 movable in left and right directions since the moving means, at one side thereof, includes the high speed linear motors 24b and 24c.

The manipulator 32 is operated by operation of the sub driving means 34. The head 42 grasps a component from the component supplying portion 50 thereby to mount.

The X frame 22b is first moved to the component supplying portion 50, and subsequently, the moving means 24 is moved. Movement in the X direction of the moving means 24 is possible via the high speed linear motor 24b and movement in the Y direction is possible via linear motor 24c.

Next, because the head 42 and the vision portion 52 are movable in a predetermined direction in the X-Y plane by the manipulator 32 disposed at a lower portion of the moving means 24, they can pick up and place a component from the component supplying portion 50 more easily.

Figure 4:
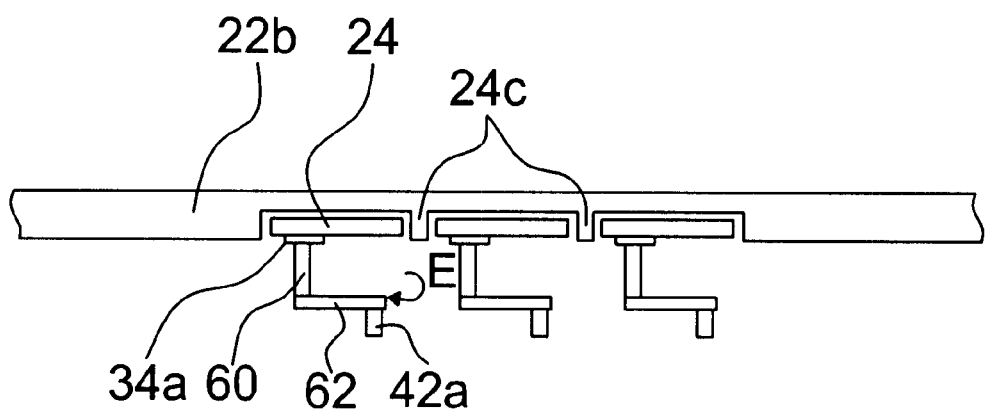
FIG. 4 is a view of moving means according to another embodiment of the present invention.

Meanwhile, when the axis 60 and the bar 62 are used as the manipulator, they are rotated in the direction of the arrow E by driving of the sub driving means 34a, as shown in FIG. 4.

When the axis 60 is rotated, the head 42a connected to the bar 62 has a linear movement. Because the head 42a is allowed to move linearly in the left and right directions, it can achieve high precision.

Furthermore, because the vision portion is disposed at the rear of the head 42a and can easily grasp the component, the individual heads 42a are moved together yet independent and can pick up and place a component more precisely.

The individual moving means 24 can be operated to move together or independently, as shown in FIGS. 5b and 5c.

When the individual moving means 24 are operated independently, a work speed can be increased because other workings are not overlapped, as shown in FIG. 5b. Furthermore, when the moving means 24 are operated together, work efficiency can be At increased because repeated work is performed.

Meanwhile, when the user intends to use moving means 44a, 44b and 44c in some form or another, as shown in FIG. 6, a work area can be decreased, thereby preventing the head from unnecessary movement.

Having described a specific preferred embodiment of the invention with reference to the accompanying drawings, it is to be understood that various changes and modifications may be effected therein by one skilled in the art without departing from the scope or spirit of the invention as defined in the appended claims.

What is claimed:

1. A surface mounting device, comprising:

a Y frame;

at least one X frame mounted on the Y frame and movable in a first direction;

a plurality of moving units mounted on each at least one X frame, wherein each moving unit is configured to move along the X frame in a second direction substantially perpendicular to the first direction; and at least one head unit mounted on each of the plurality of moving units, wherein each at least one head unit is movable in a third direction that is substantially perpendicular to the first and second directions, wherein each at least one head unit comprises:

a rotating motor mounted on one of the plurality of moving units;

a bar mounted on a rotating shaft of the motor; and an end effector mounted on the bar, wherein rotational movement of the shaft of the motor moves the end effector in both the first and second directions.

2. A surface mounting device, comprising:

a Y frame;

at least one X frame mounted on the Y frame and movable in a first direction;

at least one moving unit mounted on each at least one X frame, wherein each moving unit is configured to move along the X frame in a second direction substantially perpendicular to the first direction; and at least one head unit mounted on each moving unit, wherein each at least one head unit comprises:

a rotating motor mounted on one of the plurality of moving units, a bar mounted on a rotating shaft of the motor, and an end effector mounted on the bar, wherein rotational movement of the shaft of the motor moves the end effector in both the first and second directions.

3. The surface mounting device of claim 2, further comprising a vision device mounted on each moving unit.

4. The surface mounting device of claim 2, wherein each moving unit is also configured to move along the X frame in the first direction.

5. The surface mounting device of claim wherein a plurality of moving units are mounted on each at least one X frame.

* * * * *